US010474390B1

(12) United States Patent
Whyte

(10) Patent No.: US 10,474,390 B1
(45) Date of Patent: Nov. 12, 2019

(54) SYSTEMS AND METHOD FOR BUFFERING DATA USING A DELAYED WRITE DATA SIGNAL AND A MEMORY RECEIVING WRITE ADDRESSES IN A FIRST ORDER AND READ ADDRESSES IN A SECOND ORDER

(71) Applicant: Xilinx, Inc., San Jose, CA (US)

(72) Inventor: Andrew M. Whyte, Edinburgh (GB)

(73) Assignee: XILINX, INC., San Jose, CA (US)

( * ) Notice: Subject to any disclaimer, the term of this patent is extended or adjusted under 35 U.S.C. 154(b) by 55 days.

(21) Appl. No.: 15/586,723

(22) Filed: May 4, 2017

(51) Int. Cl.
G06F 3/06 (2006.01)
G06F 12/06 (2006.01)

(52) U.S. Cl.
CPC .......... G06F 3/0659 (2013.01); G06F 3/0604 (2013.01); G06F 3/0638 (2013.01); G06F 3/0656 (2013.01); G06F 3/0673 (2013.01); G06F 12/0646 (2013.01); G06F 2212/1008 (2013.01); G06F 2212/1016 (2013.01)

(58) Field of Classification Search
CPC .... G06F 3/0659; G06F 3/0604; G06F 3/0656; G06F 3/0673; G06F 12/0646; G06F 2212/1008; G06F 2212/1016
See application file for complete search history.

(56) References Cited

U.S. PATENT DOCUMENTS

| 5,566,123 A | * | 10/1996 | Freidin | G11C 7/1072 |
| | | | | 326/38 |
| 5,687,183 A | * | 11/1997 | Chesley | G06F 9/3834 |
| | | | | 712/E9.048 |
| 6,373,779 B1 | * | 4/2002 | Pang | G11C 7/1045 |
| | | | | 365/230.05 |

(Continued)

OTHER PUBLICATIONS

"Xilinx Read First Write First," blog started by Brad Smallridge on Sep. 28, 2004, downloaded from https://www.fpgarelated.com/showthread/comp.arch.fpga/13814-1.php , on Aug. 16, 2018, 5 pages.*
Xilinx, "Kintex UltraScale+ FPGAs Data Sheet: DC and AC Switching Characteristics," DS922 (v1.1), May 9, 2016, pp. 1-77, Xilinx, Inc., San Jose, California, USA.
Xilinx, "UltraScale Architecture Memory Resources," UG573 (v1.4), Jul. 20, 2016, pp. 1-127, Xilinx, Inc., San Jose, California, USA.

(Continued)

Primary Examiner — Glenn Gossage
(74) Attorney, Agent, or Firm — David O'Brien; Hong Shi

(57) ABSTRACT

A circuit includes a memory and an address generator configured to generate a write address signal and a read address signal, where the write address signal has a first delay relative to the read address signal. The memory is configured to receive a first plurality of write addresses, from the write address signal, including a first plurality of addresses of the memory in a first order, and write, to the first plurality of write addresses, a first plurality of data words during a first time period. The memory is further configured to receive a first plurality of read addresses, from the read address signal, including the first plurality of addresses in a second order, and read, from the first plurality of read addresses, the first plurality of data words during a second time period. The first and second time periods partially overlap. The first order may be one of a natural order and a modified order, with the second order being the other of the natural order and the modified order, and the modified order may be one of a bit-reversed order and a digit-reversed order. The memory may have different write modes, and may be a read-before-write memory or a write-before-read memory.

20 Claims, 11 Drawing Sheets

(56) References Cited

U.S. PATENT DOCUMENTS

| | | | | |
|---|---|---|---|---|
| 6,745,302 | B1* | 6/2004 | Taniguchi | G11C 7/1072 |
| | | | | 710/20 |
| 7,610,453 | B1 | 10/2009 | Parekh et al. | |
| 7,669,017 | B1 | 2/2010 | Parekh et al. | |
| 9,159,391 | B1* | 10/2015 | Shu | G11C 8/04 |
| 2007/0070730 | A1* | 3/2007 | Kim | G11C 7/1066 |
| | | | | 365/194 |
| 2007/0156995 | A1* | 7/2007 | Kaburlasos | G06F 13/4243 |
| | | | | 711/167 |
| 2010/0157691 | A1* | 6/2010 | Yu | G11C 8/16 |
| | | | | 365/189.04 |

OTHER PUBLICATIONS

Yoo, Hoyoung et al., "Partially Parallel Encoder Architecture for Long Polar Codes," IEEE Transactions on Circuits and Systems-II: Express Briefs, Mar. 2015, pp. 306-310, vol. 62, No. 3, IEEE, Piscataway, New Jersey, USA.

\* cited by examiner

| 502 | 504 Write Address | | 506 Read Address | | 508 Write phase (block) | 510 Read phase (block) |
|---|---|---|---|---|---|---|
| Clock Cycle | Value | Bit Pattern | Value | Bit Pattern | | |
| 0 | (delay) | | | | - | |
| 1 | 0 | 0000 | | | 1 | |
| 2 | 1 | 0001 | | | 1 | |
| 3 | 2 | 0010 | | | 1 | |
| 4 | 3 | 0011 | | | 1 | |
| 5 | 4 | 0100 | | | 1 | |
| 6 | 5 | 0101 | | | 1 | |
| 7 | 6 | 0110 | | | 1 | |
| 8 | 7 | 0111 | | | 1 | |
| 9 | 8 | 1000 | | | 1 | |
| 10 | 9 | 1001 | | | 1 | |
| 11 | 10 | 1010 | | | 1 | |
| 12 | 11 | 1011 | | | 1 | |
| 13 | 12 | 1100 | | | 1 | |
| 14 | 13 | 1101 | | | 1 | |
| 15 | 14 | 1110 | | | 1 | |
| 16 | 15 | 1111 | 0 | 0000 | 1 | 1 |
| 17 | 0 | 0000 | 4 | 0100 | 2 | 1 |
| 18 | 4 | 0100 | 8 | 1000 | 2 | 1 |
| 19 | 8 | 1000 | 12 | 1100 | 2 | 1 |
| 20 | 12 | 1100 | 1 | 0001 | 2 | 1 |
| 21 | 1 | 0001 | 5 | 0101 | 2 | 1 |
| 22 | 5 | 0101 | 9 | 1001 | 2 | 1 |
| 23 | 9 | 1001 | 13 | 1101 | 2 | 1 |

SYSTEMS AND METHOD FOR BUFFERING DATA USING A DELAYED WRITE DATA SIGNAL AND A MEMORY RECEIVING WRITE ADDRESSES IN A FIRST ORDER AND READ ADDRESSES IN A SECOND ORDER

TECHNICAL FIELD

Examples of the present disclosure generally relate to integrated circuits (ICs) and, in particular, to an embodiment related to system and methods for buffering data in a circuit which converts data between different orders.

BACKGROUND

Data may be transmitted according to one of many data transfer protocols. Data transfer protocols generally include protocols defined by industry standards bodies or proprietary protocols. Various digital communications standards such as IEEE 802.11, IEEE 802.16, or Digital Video Broadcasting-Terrestrial (DVB-T) use Fourier Transforms, and in particular use Fourier Transforms as part of Orthogonal Frequency Division Multiplexing (OFDM) systems. Fourier transforms may be implemented using Fast Fourier Transforms (FFT) algorithms. The inverse operation of an FFT is called Inverse Fast Fourier Transform (IFFT). FFT algorithms may be implemented using Radix-2, Radix-4, or some other Radix algorithm. In an FFT circuit, if the input data to the FFT circuit are provided in a bit/digit-reversed order, then the output data of the FFT circuit are in a natural order. Similarly, if the input data to the FFT circuit are in a natural order, the output data of the FFT circuit is in a bit/digit-reversed order. As such, a data reordering system may be used for reordering the data (e.g., convert data from a bit/digit-reversed order to a natural order or vice versa) for the FFT circuit. However, some data buffering systems for reordering data may have specific requirements on the memories that they use, which may limit circuit performance and reduce throughput.

Accordingly, there is a need for improved systems and methods for reordering data.

SUMMARY

In some embodiments in accordance with the present disclosure, a circuit includes an address generator configured to generate a write address signal and a read address signal, wherein the write address signal has a first delay relative to the read address signal. The circuit further includes a memory configured to receive, from the write address signal, a first plurality of write addresses including a first plurality of addresses of the memory in a first order; write, to the first plurality of write addresses, a first plurality of data words during a first time period; receive, from the read address signal, a first plurality of read addresses of the memory including the first plurality of addresses in a second order; and read, from the first plurality of read addresses, the first plurality of data words during a second time period, wherein the first and second time periods partially overlap.

In some embodiments, the memory is further configured to receive, from the write address signal, a second plurality of write addresses including the first plurality of addresses in the second order; and write a second plurality of data words to the second plurality of write addresses during a third time period, wherein the second and third time periods partially overlap.

In some embodiments, the address generator is configured to generate the write address signal and read address signal using a first address signal, and the address generator includes a first delay unit configured to apply the first delay to the first address signal to generate the write address signal.

In some embodiments, the circuit further includes a second delay unit configured to apply the first delay to a write data signal synchronized with the first address signal to generate a delayed write data signal; wherein the memory is configured to receive the first plurality of data words to write to the memory from the delayed write data signal.

In some embodiments, the circuit further includes a third delay unit configured to apply the first delay to a write enable signal synchronized with the write data signal to generate a delayed write enable signal; wherein the memory is configured to enable write operations to the memory based on the delayed write enable signal.

In some embodiments, the memory is a read-before-write memory.

In some embodiments, the memory is a write-before-read memory.

In some embodiments, the address generator includes a write address generator configured to generate a first address signal; a read address generator configured to generate the read address signal synchronized with the first address signal; and a first delay unit configured to apply the first delay to the first address signal to generate the write address signal.

In some embodiments, the first plurality of read addresses include cyclic prefix addresses.

In some embodiments, the first order is one of a natural order and a modified order, and the second order is the other of the natural order and the modified order.

In some embodiments, the modified order is one of a bit-reversed order and a digit-reversed order.

In some embodiments, a method includes writing, to a memory, a first plurality of data words at a plurality of addresses according to a first order, wherein the writing of the first plurality of data words includes: during a first clock cycle, writing a first data word of the first plurality of data words at a first address of the plurality of addresses; and reading, from the memory, the first plurality of data words at the plurality of addresses according to a second order, wherein the reading of the first plurality of data words includes: during the first clock cycle, reading a second data word of the first plurality of data words at a second address of the plurality of addresses.

In some embodiments, the method further includes providing, to the memory, a read address signal and a write address signal generated based on a first address signal, wherein the write address signal has a first delay relative to the read address signal. The writing of the first plurality of data words is based on the plurality of addresses in the first order provided by the write address signal, and the reading of the first plurality of data words is based on the plurality of addresses in the second order provided by the read address signal.

In some embodiments, the method further includes writing, to the memory, a second plurality of data words at the plurality of addresses according to the second order based on the write address signal during a third time period including a second clock cycle; and reading, from the memory, the second plurality of data words at the plurality of addresses according to the first order based on the read address signal during a fourth time period including the second clock cycle.

In some embodiments, the writing of the second plurality of data words includes: during a second clock cycle, writing a third data word of the second plurality of data words at the second address of the plurality of addresses, and the reading of the second plurality of data words includes: during the second clock cycle, reading a fourth data word of the first plurality of data words at a third address of the plurality of addresses.

In some embodiments, the method further includes processing the first plurality of data words according to a Fourier transform function.

In some embodiments, the method further includes processing the first plurality of data words according to a polar error-correcting code.

In some embodiments, during the first clock cycle, the writing of the first data word is performed prior to the reading of the second data word.

In some embodiments, during the first clock cycle, the writing of the first data word is performed after the reading of the second data word.

Other aspects and features will be evident from reading the following detailed description and accompanying drawings.

BRIEF DESCRIPTION OF THE DRAWINGS

FIG. 7B is a table illustrating read and write operations of a data buffering system for a 16-point FFT circuit according to some embodiments of the present disclosure.

FIG. 8 is a table illustrating read and write operations of a data buffering system for addressing schemes including cyclic prefixes of various lengths according to some embodiments of the present disclosure.

DETAILED DESCRIPTION

Figure 1:
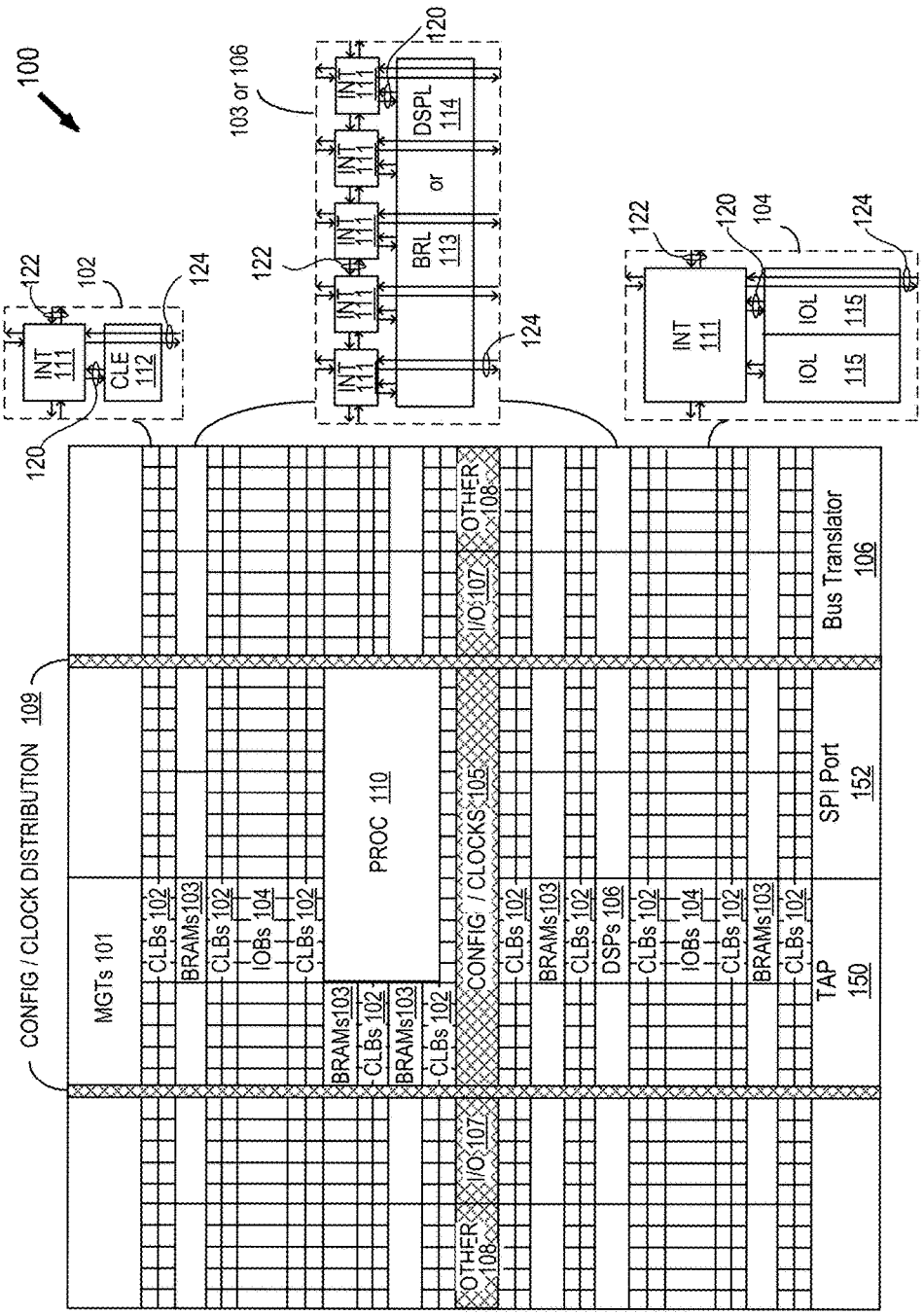
FIG. 1 is a block diagram illustrating an exemplary architecture for an IC according to some embodiments of the present disclosure.

Various embodiments are described hereinafter with reference to the figures, in which exemplary embodiments are shown. The claimed invention may, however, be embodied in different forms and should not be construed as being limited to the embodiments set forth herein. Like reference numerals refer to like elements throughout. Like elements will, thus, not be described in detail with respect to the description of each figure. It should also be noted that the figures are only intended to facilitate the description of the embodiments. They are not intended as an exhaustive description of the claimed invention or as a limitation on the scope of the claimed invention. In addition, an illustrated embodiment needs not have all the aspects or advantages shown. An aspect or an advantage described in conjunction with a particular embodiment is not necessarily limited to that embodiment and can be practiced in any other embodiments even if not so illustrated, or if not so explicitly described. The features, functions, and advantages may be achieved independently in various embodiments or may be combined in yet other embodiments.

Before describing exemplary embodiments illustratively depicted in the several figures, a general introduction is provided to further understanding. In implementations of forward FFT or inverse FFT, the input data to an FFT circuit and the output data of the FFT circuit may be in different orders (e.g., one is in a natural order, and the other is in a bit/digit-reversed order). For example, an 8-point FFT data block has 8 data words represented by indexes 0, 1, 2, 3, ..., 7, which is in a natural order. These 8 index values are represented in binary in a natural order as 000, 001, 010, ..., 111. A bit-reversed order is based on the binary number representation of the index values. A bit-reversed index of a particular index is generated by reversing the order of the binary bits of that particular index. Accordingly, the natural order as previously shown corresponds to a bit-reversed order of 000, 100, 010, ..., 111. For example, the binary value 001 corresponding to the decimal value of 1 is represented in the bit-reversed order as a binary value of 100. Similarly, the binary value 010 corresponding to the decimal value of 2 is represented in a bit-reversed order as a binary value of 010. Therefore, the sequence of consecutive decimal integers from 0-7 in a natural order translates to the decimal values 0, 4, 2, 6, 1, 5, 3, 7 in bit-reversed order. Accordingly, for a given indexing order of the 8 data words of an 8-point FFT data block in the FFT input data, the output data of the FFT circuit may be in a modified indexing order for those 8 data words. For radix-2 FFT, the modified indexing order may be a bit-reversed order. For higher radix implementations, the modified indexing order may be a digit-reversed order. The digit-reversed order is another form of a modified indexing order, where instead of a group of 1 bit, a group of 2 or more bits is reversed. In an example, the reversed ordering in radix-4 FFT is performed in groups of 2 bits. Similarly, the reversed ordering in radix-8 FFT may be in groups of 3 bits.

In an application requiring bit/digit reversion, conversions (also referred to as reordering) between the bit/digit-reversed order and the natural order may be used either at the input or at the output of the FFT circuit. For an N-point FFT circuit, N data words of an N-point FFT data block are stored in a buffering system for performing the conversion. In some examples, two buffers (also referred to as ping-pong buffering) are used so that data may be read from one of the buffers without interfering with the reordering in the other buffer. However, such ping-pong buffering may require additional control circuits, and may be resource inefficient. In other examples, to avoid ping-pong buffering, a buffering system may use a read-before-write memory for reordering. However, such a read-before-write memory may not be readily available in application specific integrated circuit (ASIC) libraries. Also, using such a read-before-write memory may limit circuit performance because it has reduced clock frequency performance in field programmable gate array (FPGA) implementations compared to write-before-read memories. In an example, by switching an FPGA device from a write-before-read memory mode to a read-before-write memory mode, a performance penalty (e.g., a reduction from 645 megahertz (MHz) to 575 megahertz (MHz) in the clock rate of the circuit implemented in the FPGA device may incur. Further, in some examples, a buffering system may use a single-port memory for reordering, which may require additional control circuitry to manage the data flow when cyclic prefix data are inserted (e.g., in OFDM downlink applications).

For integrated circuit (IC) solutions, it has been discovered that by breaking the dependency between read and write operations in a memory during reordering, a buffer system for reordering may be implemented using memories with different write modes (e.g., a read-before-write mode, a write-before-read mode) and multiple ports (e.g., a dual-port memory). Such implementations may improve circuit performance and system throughput, reduce the cost, and provide more design flexibility. With the above general understanding borne in mind, various embodiments for scheduling memory operations are generally described below.

Because one or more of the above-described embodiments are exemplified using a particular type of IC, a detailed description of such an IC is provided below. However, it should be understood that other types of ICs may benefit from one or more of the embodiments described herein.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external programmable read only memory (PROM)) or written into the FPGA by an external device. The collective states of the individual memory cells then determine the function of the FPGA.

Another type of PLD is the Complex Programmable Logic Device (CPLD). A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

In general, each of these programmable logic devices ("PLDs"), the functionality of the device is controlled by configuration data provided to the device for that purpose. The configuration data can be stored in volatile memory (e.g., static memory cells, as common in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

As noted above, advanced FPGAs can include several different types of programmable logic blocks in the array. For example, FIG. 1 illustrates an exemplary FPGA architecture 100. The FPGA architecture 100 includes a large number of different programmable tiles, including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile can include at least one programmable interconnect element ("INT") 111 having connections to input and output terminals 120 of a programmable logic element within the same tile, as shown by examples included at the top of FIG. 1. Each programmable interconnect element 111 can also include connections to interconnect segments 122 of adjacent programmable interconnect element(s) in the same tile or other tile(s). Each programmable interconnect element 111 can also include connections to interconnect segments 124 of general routing resources between logic blocks (not shown). The general routing resources can include routing channels between logic blocks (not shown) comprising tracks of interconnect segments (e.g., interconnect segments 124) and switch blocks (not shown) for connecting interconnect segments. The interconnect segments of the general routing resources (e.g., interconnect segments 124) can span one or more logic blocks. The programmable interconnect elements 111 taken together with the general routing resources implement a programmable interconnect structure ("programmable interconnect") for the illustrated FPGA.

In an example implementation, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP (tile) 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the example of FIG. 1, an area (depicted horizontally) near the center of the die (e.g., formed of regions for logic 105, blocks 107, and logic 108 shown in FIG. 1) can be used for configuration, clock, and other control logic. Column 109 (depicted vertically) extending from this horizontal area or other columns may be used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, PROC 110 spans several columns of CLBs and BRAMs. PROC 110 can include various components ranging from a single microprocessor to a complete programmable processing system of microprocessor(s), memory controllers, peripherals, and the like.

In one aspect, PROC 110 is implemented as dedicated circuitry, e.g., as a hard-wired processor, that is fabricated as part of the die that implements the programmable circuitry of the IC. PROC 110 can represent any of a variety of different processor types and/or systems ranging in complexity from an individual processor, e.g., a single core capable of executing program code, to an entire processor system having one or more cores, modules, co-processors, interfaces, or the like.

In another aspect, PROC 110 is omitted from architecture 100, and may be replaced with one or more of the other varieties of the programmable blocks described. Further, such blocks can be utilized to form a "soft processor" in that the various blocks of programmable circuitry can be used to form a processor that can execute program code, as is the case with PROC 110.

The phrase "programmable circuitry" can refer to programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC. For example, portions shown in FIG. 1 that are external to PROC 110 such as CLBs 102 and BRAMs 103 can be considered programmable circuitry of the IC.

In some embodiments, the functionality and connectivity of programmable circuitry are not established until configuration data is loaded into the IC. A set of configuration data can be used to program programmable circuitry of an IC such as an FPGA. The configuration data is, in some cases, referred to as a "configuration bitstream." In general, programmable circuitry is not operational or functional without first loading a configuration bitstream into the IC. The configuration bitstream effectively implements or instantiates a particular circuit design within the programmable circuitry. The circuit design specifies, for example, functional aspects of the programmable circuit blocks and physical connectivity among the various programmable circuit blocks.

In some embodiments, circuitry that is "hardwired" or "hardened," i.e., not programmable, is manufactured as part of the IC. Unlike programmable circuitry, hardwired circuitry or circuit blocks are not implemented after the manufacture of the IC through the loading of a configuration bitstream. Hardwired circuitry is generally considered to have dedicated circuit blocks and interconnects, for example, that are functional without first loading a configuration bitstream into the IC, e.g., PROC 110.

In some instances, hardwired circuitry can have one or more operational modes that can be set or selected according to register settings or values stored in one or more memory elements within the IC. The operational modes can be set, for example, through the loading of a configuration bitstream into the IC. Despite this ability, hardwired circuitry is not considered programmable circuitry as the hardwired circuitry is operable and has a particular function when manufactured as part of the IC.

FIG. 1 is intended to illustrate an exemplary architecture that can be used to implement an IC that includes programmable circuitry, e.g., a programmable fabric. For example, the numbers of logic blocks in a row, the relative width of the rows, the number and order of rows, the types of logic blocks included in the rows, the relative sizes of the logic blocks, and the interconnect/logic implementations included at the top of FIG. 1 are purely exemplary. For example, in an actual IC, more than one adjacent row of CLBs is typically included wherever the CLBs appear, to facilitate the efficient implementation of user logic, but the number of adjacent CLB rows varies with the overall size of the IC. Moreover, the FPGA of FIG. 1 illustrates one example of a programmable IC that can employ examples of the interconnect circuits described herein. The interconnect circuits described herein can be used in other types of programmable ICs, such as CPLDs or any type of programmable IC having a programmable interconnect structure for selectively coupling logic elements.

It is noted that the IC that may implement the data reordering is not limited to the exemplary ICs depicted in FIG. 1, and that IC having other configurations, or other types of IC, may also implement the data reordering system.

Figure 2A:
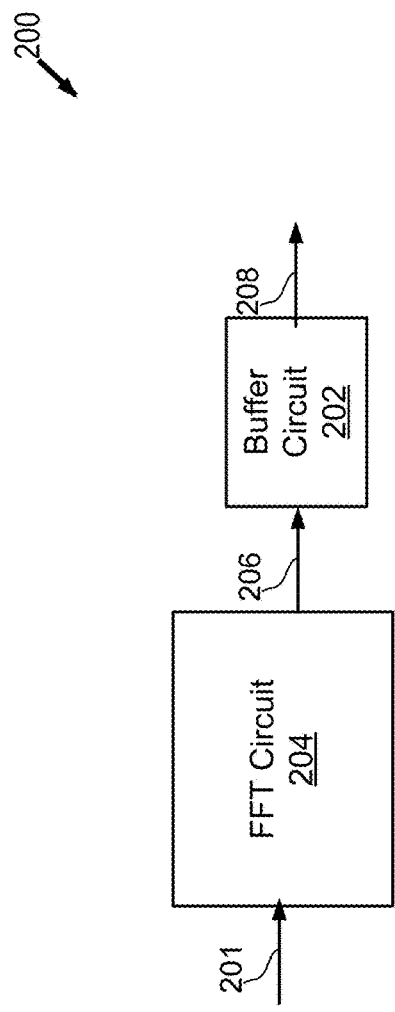
FIG. 2A is a block diagram illustrating an exemplary data buffering system according to some embodiments of the present disclosure.

Referring to FIG. 2A, a block diagram of a circuit for buffering data for an FFT circuit is shown. As shown in FIG. 2A, the FFT module 200 comprises an FFT circuit 204, which sends to a buffer circuit 202, a buffer input signal 206 including buffer input data. The buffer circuit 202 outputs a buffer output signal 208 including buffer output data. The buffer circuit 202 may be used to perform data reordering, which converts data between different orders. In an example, the FFT circuit 204 may perform FFT of input data included in an FFT input signal 201, and generate the buffer input signal 206 including buffer input data. In some embodiments, the data words of a particular FFT data block in the FFT input signal 201 are in a natural order, the corresponding data words in the buffer input signal 206 are in a bit/digit-reversed order, and the corresponding data words in the buffer output signal 208 are again in a natural order.

Figure 2B:
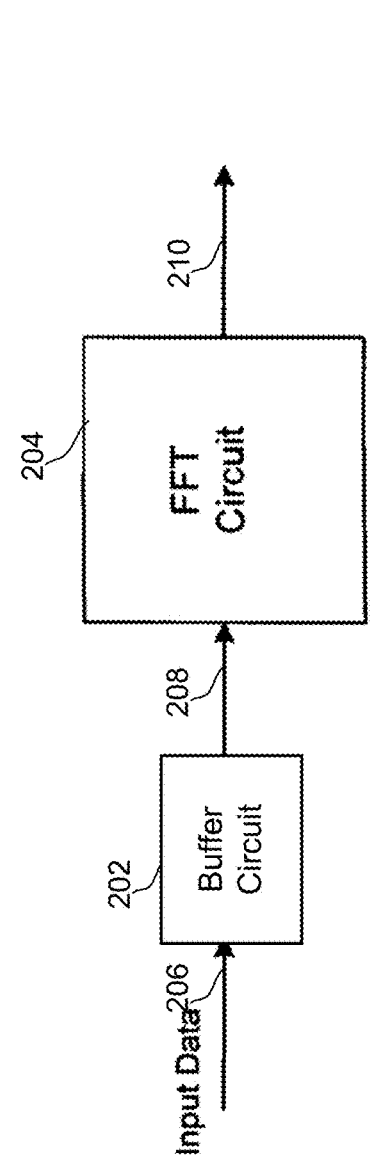
FIG. 2B is a block diagram illustrating another exemplary data buffering system according to some embodiments of the present disclosure.

Alternatively, as illustrated in FIG. 2B, in some embodiments, the buffer circuit 202 may be coupled to an input of the FFT circuit 204 to provide the conversion of data between different orders. As shown in FIG. 2B, the FFT module 250 comprises a buffer circuit 202 receiving a buffer input signal 206 including buffer input data. The buffer circuit 202 then sends a buffer output signal 208 including buffer output data to an FFT circuit 204. The buffer circuit 202 may be used to perform data reordering, which converts data between different orders. The FFT circuit 204 may perform FFT of the buffer output data in the buffer output signal 208, and generate a signal 210 including FFT output data. In some embodiments, the data words of a particular FFT data block in the buffer input signal 206 sent to the buffer circuit 202 are in a natural order, and the data words of that particular FFT data block in the buffer output signal 208 provided by the buffer circuit 202 are in a bit/digit-reversed order. In those embodiments, the data words of that particular FFT data block in the FFT output signal 210 of the FFT circuit 204 are again in a natural order.

In various embodiments, the buffer circuit 202 may use various types of memories, or a memory operating under various write modes including, for example, a read-before-write mode, and a write-before-read mode. In some embodiments, the memory operates under a read-before-write mode, and such a memory may be referred to as a read-before-write memory. In a read-before-write memory, during a write operation, if a read operation occurs at the same address, the read operation is performed before the write operation is performed, and as such, old data of that address appears at the data output of the memory. In some embodiments, the memory operates under a write-before-read mode, and such a memory may be referred to as a write-before-read memory. In a write-before-read memory, during a write operation, if a read operation occurs at the same address, the write operation is performed before the read operation. As such, new data of that address appears at the data output of the memory.

Figure 3:
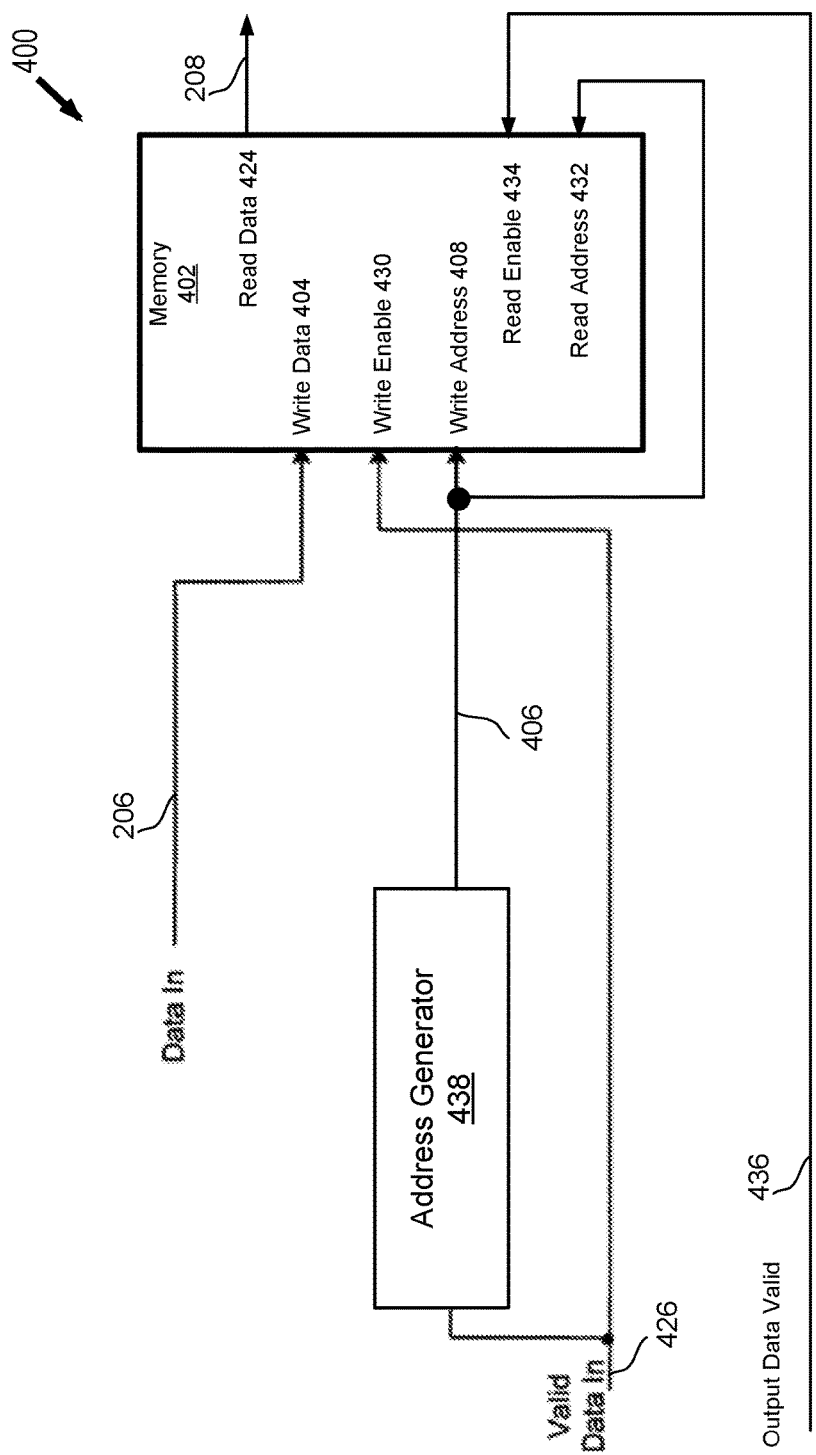
FIG. 3 is a block diagram illustrating still another exemplary data buffering system according to some embodiments of the present disclosure.
Figure 4:
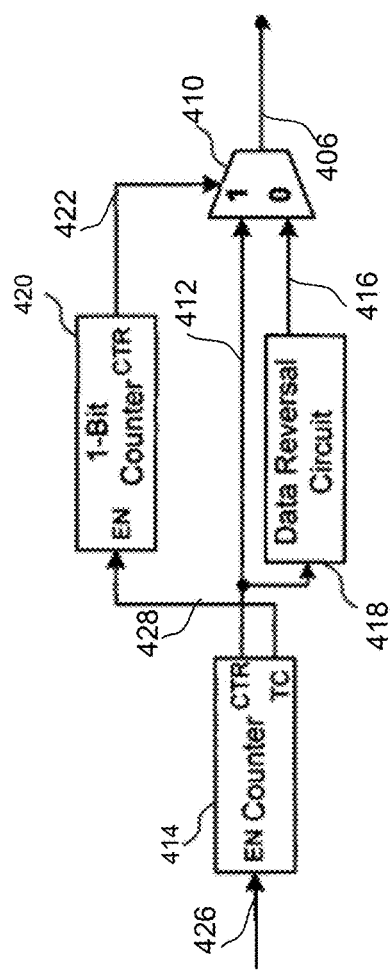
FIG. 4 is a block diagram illustrating an exemplary address generator for a data buffering system according to some embodiments of the present disclosure.
Figure 5:
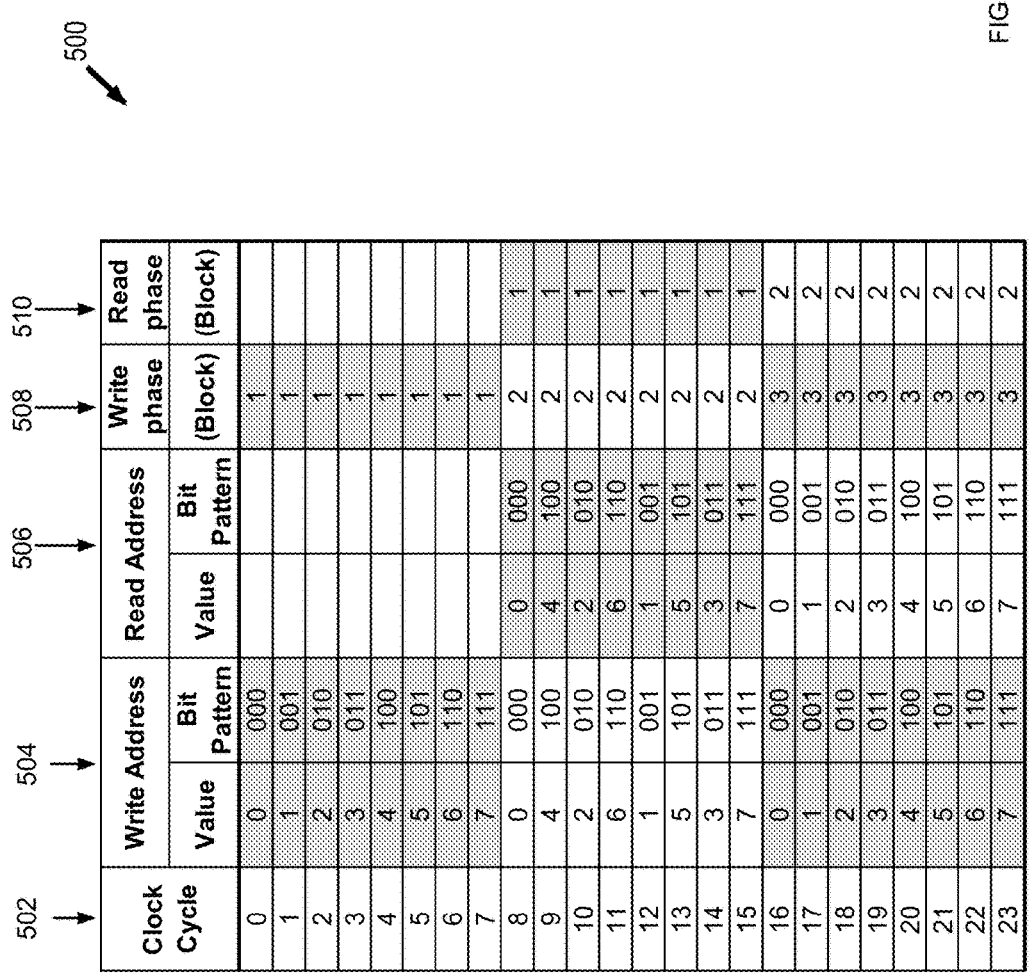
FIG. 5 is a table illustrating read and write operations of a data buffering system according to some embodiments of the present disclosure.

Referring to FIGS. 3, 4, and 5, a buffer circuit 400 using a read-before-write memory may be used as the buffer circuit 202 of the FFT modules 200 and 250 of FIGS. 2A and 2B. FIG. 3 illustrates an exemplary buffer circuit 400 including a simple dual-port, read-before-write memory 402 for converting data received in a bit/digit-reversed order to a natural order or vice versa. FIG. 4 illustrates an exemplary address generator 450 for the buffer circuit 400. FIG. 5 illustrates a table 500 for read and write operations of the buffer circuit 400.

Referring to FIG. 3, a buffer circuit 400 may include a memory 402. The memory 402 may include an addressable memory, for example, a random access memory (RAM). In an example, for an 8-point FFT, the memory 402 may have 8 memory locations having addresses 0 through 7. In the example of FIG. 3, a memory 402 includes a write data terminal 404 for receiving a buffer input signal 206. The memory 402 also includes a write address terminal 408 configured to receive an address signal 406 including addresses for the corresponding data words in the buffer input signal 206. An address generator 438 may receive a signal 426 and generate an address signal 406. The signal 426 may be a single-bit signal used to indicate the validity of the buffer input data in the buffer input signal 206, and may be used as an enable for the address generator 438. The address signal 406 may include addresses in different orders. For example, the address signal 406 may include addresses in a natural order corresponding to normal index values or in a bit-reversed order corresponding to bit-reversed index values.

In some embodiments, the signal 426 is sent to a write enable terminal 430 of the memory 402, which may be used to enable and disable write operations.

In some embodiments, the address signal 406 is also sent to the read address terminal 432 of the memory 402. Because the same address signal 406 is sent to both the write address terminal 408 and the read address terminal 432, a write operation and a read operation at the same address may be performed during the same clock cycle. Because the memory 402 is a read-before-write memory, a read operation is performed to read a previously stored data word from a particular address prior to the write operation writing a new data word to that particular address. As such, the previously stored data word at that particular address is provided at the buffer output signal 208 through the read data terminal 424.

In some embodiments, a signal 436 may be used to indicate the validity of the buffer output data in the buffer output signal 208. The signal 436 may be sent to a read enable terminal 434 of the memory 402 to enable and/or disable read operations.

Referring to FIG. 4, illustrated is an exemplary address generator 450 that may be implemented as the address generator 438 of FIG. 3. The address generator 450 includes a multiplexer 410, which is coupled to select a count output CTR 412 of a counter 414 or an output 416 of a data reversal circuit 418. The data reversal circuit 418 may be configured to provide bit reversal, digit reversal, or some other modifications.

In some embodiments, a one-bit counter 420 coupled to the terminal count (TC) of the counter 414 may generate an output 422, which controls the select port of the multiplexer 410, which toggles between the count output CTR 412 and the output 416 for the addresses provided in the address signal 406. Accordingly, the addresses in the address signal 406 may alternate between a natural order and a modified order. The modified order may be a bit-reversed order, a digit-reversed order, or other suitable order depending upon the application.

In some embodiments, for a buffer circuit 400 used for an 8-point FFT circuit, the signal 426 may enable a 3-bit counter 414 for generating 8-point address locations. This modulo 8 counter 414 may also generate the control signal 412, which may indicate that the counter 414 has counted 8 times. The output bits in the signal 412 of the counter 414 and their reversed bits in the signal 416 are sent to the 2:1 multiplexer 410. The TC signal 428 acts as an enable signal to the 1-bit counter 420. This 1-bit counter 420 alternates between 0 and 1, where each state of the 0 state and 1 state lasts for 8 clock cycles.

Referring to FIG. 5, table 500 illustrates the read and write addresses in natural and bit-reversed orders for an 8-point FFT module 200 using a buffer circuit 400 of FIG. 3. For an 8-point FFT module 200, there are only 8 data words in an FFT data block, therefore the binary representation for such indexing can be shown with just 3 bits. The memory 402 includes 8 memory locations having addresses 0 through 7.

As shown in column 504 of table 500, during clock cycles 0 through 7, write addresses are provided in a natural order. In an example, the write addresses in the natural order have values 0, 1, 2, 3, 4, 5, 6, 7, with corresponding bit patterns "000," "001," "010," "011," "100," "101," "110," and "111." Column 508 illustrates that during clock cycles 0 through 7, a first data block including 8 data words are written to the memory locations 0 through 7 according to the write addresses in a natural order. As shown by column 506, during clock cycles 0 through 7, no read address is provided. As such, no data are read from the memory 402 at memory locations 0 through 7 during clock cycles 0 through 7.

During clock cycles 8 through 15, column 504 illustrates that write addresses in a bit-reversed order are provided. In the illustrated example, the write addresses have values 0, 4, 2, 6, 1, 5, 3, 7 with corresponding bit patterns "000," "100," "010," "110," "001", "101", "011," and "111." These write addresses in a bit-reversed order are generated by applying a bit reverse to the corresponding write addresses in the natural order. For example, "000" is generated by applying a bit reverse to "000," and "100" is generated by applying a bit reverse to "001." Column 508 illustrates that during clock cycles 8 through 15, a second data block including 8 data words are written to the memory locations 0 through 7 according to the write addresses in the bit-reversed order.

Columns 506 and 510 illustrate that during clock cycles 8 through 15, the first data block including 8 data words are read from the memory locations 0 through 7 according to the read addresses in the bit-reversed order. As such, the buffer output data in the buffer output signal 208 of the memory 402 of FIG. 3 are in bit-reversed order during clock cycles 8 through 15.

During cycles 16 to 23, columns 504 and 508 illustrate that a third data block is written to the memory locations 0 through 7 in a natural order. Columns 506 and 510 illustrate that the second data block is read from the memory locations 0 through 7 in a natural order (e.g., using memory addresses in the order of 0, 1, 2, 3, 4, 5, 6, 7).

As shown in FIGS. 3, 4, and 5, to ensure that the buffer circuit 400 of FIG. 3 operates to provide output data as provided in table 500, the memory 402 needs to use a read-before-write memory. For example, during a single clock cycle, when a read operation and a write operation operate on the same address, the read operation is performed prior to the write operation so that old data at that particular address may be provided in the buffer output signal 208. For example, at clock cycle 8, a data word in the first block at the memory location 0 is read out from the memory location 0 prior to another data word in a second block being written to the memory location 0, so that that data word in the first block is provided at the buffer output signal 208. For further example, at clock cycle 9, a data word in the first block at the memory location 4 is read out immediately prior to another word in the second block being written to the memory location 4, so that the data word in the first block is provided at the buffer output signal 208.

As discussed above, compared with a write-before-read memory, a read-before-write memory may not be readily available in ASIC libraries for ASIC implementations, and limit circuit performance in FPGA implementations. However, using a write-before-read memory 402 in the buffer circuit 400 of FIG. 3 may result in incorrect buffer output data in the buffer output signal 208. As illustrated by columns 504 and 506, there is an address overlap between the write operation and the read operation for each clock cycle from clock cycle 8. For example, at clock cycle 8, in a buffer circuit 400 using a write-before-read memory 402, a new data word of a second block is written into a memory location 0 immediately prior to a read operation being performed on the memory location 0. As such, the read operation fails to read the previously stored word of the first block from the memory location 0. Instead, incorrect data (e.g., the new word of the second block) is retrieved by the read operation and provided at the buffer output signal 208 of the buffer circuit 400.

Referring to FIGS. 6A, 6B, 7A, 7B, 8, and 9, a data buffering system for reordering that may use a write-before-read memory is described. As described in detailed below, by delaying the write operations by one or more clock cycles and keeping the clock cycles for the read operations the same, address overlaps between write operations and read operations are removed while ensuring that a particular data word in the memory is available when the corresponding read operation occurs. This allows the data buffering system to use a write-before-read memory, which provides improved circuit performance and better design flexibility. Note that in some embodiments, the data buffer system of FIGS. 6A, 6B, 7A, 7B, 8, and 9 may also use a read-before-write memory. However, as discussed above, those embodiments may have performance limitations associated with read-before-write memories.

Figure 6A:
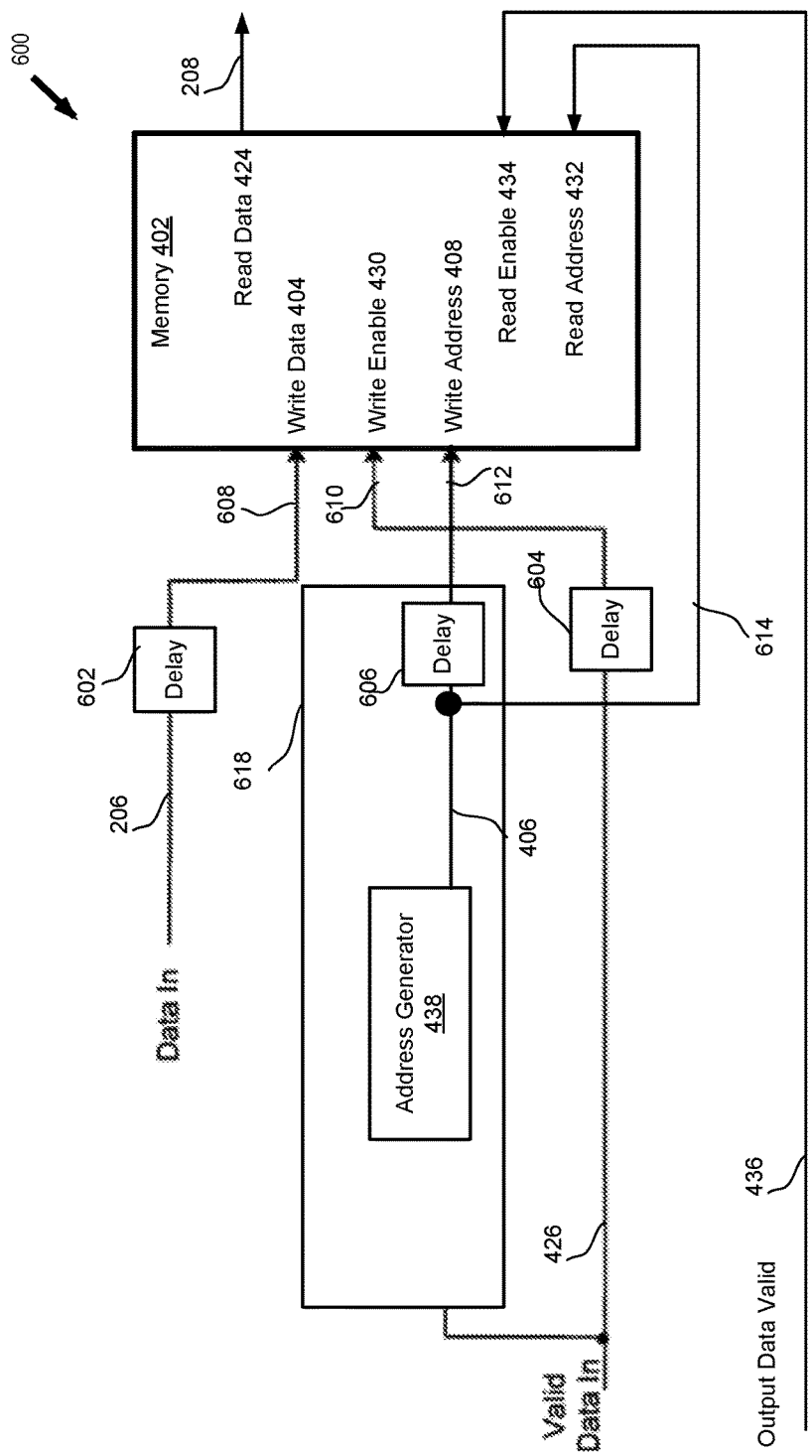
FIG. 6A is a block diagram illustrating yet another exemplary data buffering system according to some embodiments of the present disclosure.

Referring to FIG. 6A, an exemplary buffer circuit 600 that may be used in the buffer circuit 202 of FIG. 3 is illustrated. The buffer circuit 600 is substantially similar to the buffer circuit 400 of FIG. 3 except for the differences described below. In the buffer circuit 600, by generating an offset between the read and write operations, address overlaps between write operations and read operations are avoided. As such, the memory 402 may operate in either a read-before-write mode or a write-before-read mode. As shown in the illustrated example, an offset between the read and write operations is generated by applying a delay to the write operations while the clock cycles for the read operations remain unchanged. Specifically, delay units 602, 604, and 606 are coupled to the signals 206, 426, 406 to generate a write data signal 608, a write enable signal 610, and a write address signal 612 respectively. In an example, each of the delay units 602, 604, and 606 includes a register and has the same delay period. The delay period may be one clock cycle or two or more clock cycles. On the other hand, no additional delay is applied to the read operations. In other words, the clock cycles for the read operations may remain unchanged. In the example of FIG. 6A, an address generator 618 uses a delay unit 606 to apply a delay period to the address signal 406 to generate the write address signal 612, while providing a read address signal 614 using the address signal 406 without applying any delay to the address signal 406. As such, the write address signal 612 has a delay relative to the read address signal 614. As illustrated in FIG. 6A, no additional delay is applied to the read enable signal 436.

It is noted that while the memory 402 illustrated in the example of FIG. 6A includes a simple dual-port memory, different types of memory may be used in the memory 402. In a particular example, the memory 402 may include a dual-port memory including two read ports and/or two write ports.

Figure 6B:
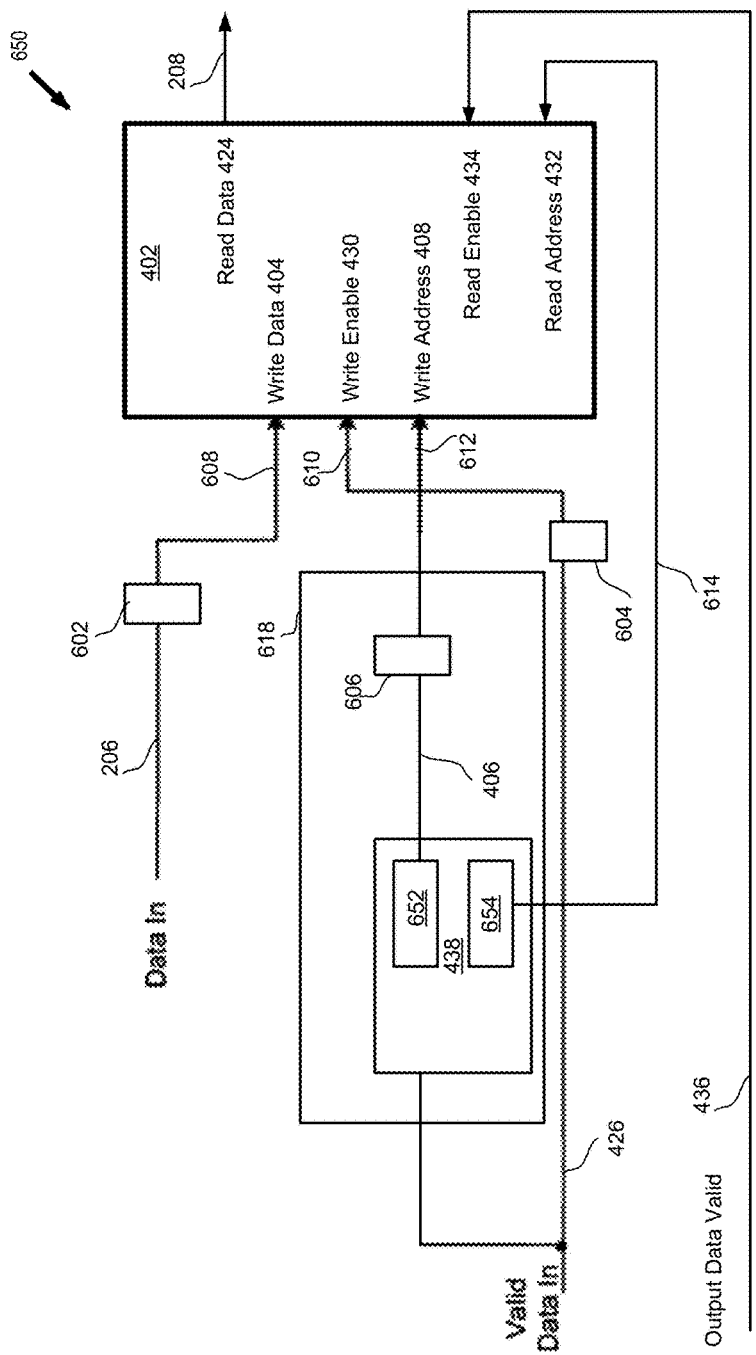
FIG. 6B is a block diagram illustrating still yet another exemplary data buffering system according to some embodiments of the present disclosure.

Referring to FIG. 6B, in some embodiments, separate but synchronized address generators may be used to generate the read address signal and write address signal. The buffer circuit 650 is substantially similar to the buffer circuit 600 of FIG. 6A except the differences described below. In the buffer circuit 650, the address generator 438 includes a write address generator 652 and a read address generator 654. In an example, the write address generator 652 and the read address generator 654 are synchronized (e.g., by using the same clock signal). The write address generator 652 may generate an address signal 406. The address generator 618 may apply a delay period to the address signal 406 using the delay unit 606 to generate the write address signal 612. The read address generator 654 may generate a read address signal 614, which is sent to the read address terminal 432 of the memory 402. In some embodiments, the read address signal 614 and the address signal 406 are synchronized, and include the same sequences of addresses. In some embodiments, the read address generator 654 may additionally insert cyclic prefix addresses to each sequence of addresses for a block of data, in the read address signal 614.

Figure 7A:
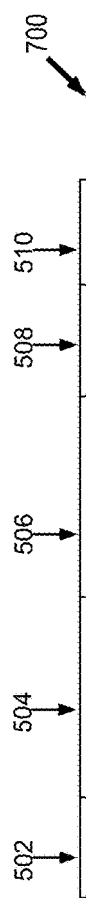
FIG. 7A is a table illustrating read and write operations of a data buffering system for an 8-point FFT circuit according to some embodiments of the present disclosure.

Referring to FIGS. 2A, 6A, 7A and 7B, the buffer circuit 600 may be used for an FFT circuit outputting data in a bit-reverse or digit-reverse order. A table 700 of FIG. 7A illustrates write addresses and read addresses in natural and bit-reversed orders for a buffer circuit 600 used in an 8-point FFT module 200 applying bit-reverse. A table 750 of FIG. 7B illustrates write addresses and read addresses in natural and bit-reversed orders for a buffer circuit 600 used in a 16-point FFT module 200 outputting data in a digit-reverse order.

Referring to FIG. 7A, a table 700 includes columns 502, 504, 506, 508, and 510. Column 502 includes the clock cycles for read operations and write operations. Column 504 illustrates write addresses for the write operations. Column 506 illustrates the read addresses for the read operations. Column 508 illustrates the write phases indicating a block number for a particular data word to be written to the memory 402. Column 510 illustrates the read phases indicating the block number of a particular data word that is read from the memory 402. As shown in table 700, at clock cycle 0, no write address is provided to the write address terminal 408 of the memory 402 because of a delay of a clock cycle that is applied to the write address signal 612. Similarly, at clock cycle 0, no write data is provided to the write data terminal 404 of the memory 402. In an example, at clock cycle 0, a write enable signal 610 may include a value indicating that a write operation is not enabled may be provided to the write enable terminal 430 of the memory 402.

Columns 504 and 508 of table 700 illustrate the write addresses and the data block for the data words written to the memory 402 by the write operations. During clock cycles 1 through 8, write addresses in a natural order are provided, and a first data block including 8 data words are written to memory locations 0 through 7 according to the write addresses in a natural order. During clock cycles 9 through 16, write addresses in a bit-reversed order are provided, and a second data block including 8 data words are written to the memory locations 0 through 7 according to the write addresses in a bit-reversed order. During the next 8 clock cycles from clock cycles 17 through 24, write addresses in a natural order are provided, and a third data block including 8 data words are written to the memory locations 0 through 7 according to the write addresses in a natural order.

Columns 506 and 510 of table 700 illustrate the read addresses and the data block for the data words retrieved by the read operations. During clock cycles 0 through 7, no read address is provided to the read address terminal 432 of the memory 402. Thus, no data are read from the memory 402 at memory locations 0 through 7 during clock cycles 0 through 7. During clock cycles 8 through 15, read addresses in a bit-reversed order are provided, and read operations are performed to read the 8 data words in the first data block from the read addresses in the bit-reversed order. As such, the data words of the first data block are written to the memory 402 according to write addresses in a natural order (e.g., during clock cycles 1 through 8), and read from the memory 402 according to read addresses in a bit-reversed order (e.g., during clock cycles 8 through 15). Accordingly, the buffer circuit 600 reorders the data words in the first data block (e.g., from a natural order in the buffer input signal 206 to a bit-reversed order in the buffer output signal 208).

During clock cycles 16 through 23, read addresses in a natural order are provided, and read operations are performed to read the 8 data words in the second data block from the read addresses in a natural order. As such, the 8 data words of the second data block are written to the memory 402 according to write addresses in a bit-reversed order (e.g., during cycles 9 through 16), and read from the memory 402 according to read addresses in a natural order (e.g., during clock cycles 16 through 23). Accordingly, the buffer circuit 600 reorders the data words in the second data block (e.g., from a natural order in the buffer input signal 206 to a bit-reversed order in the buffer output signal 208).

As illustrated in FIGS. 6A, 6B, and 7A, because of the delays applied to the write data signal 608, write enable signal 610, and write address signal 612, address overlaps between read operations and write operations are removed. The buffer circuits 600 and 650 may use either a write-before-read memory or a read-before-write memory without data corruption in the buffer output signal 208. For example, as shown in table 700 of FIG. 7A, at clock cycle 8, data words of the same data block may be written to and read from different addresses during the same clock cycle. In that example, a write operation writes a data word of the first data block to a write address of 7, and a read operation reads another data word of the first data block from a read address of 0, which is different from the write address of 7. For further example, at clock cycle 9, data words of different data blocks may be written to and read from different addresses during the same clock cycle. In that example, a write operation writes a data word of the second data block to a write address of 0, and a read operation reads another data word of the first data block from a memory address of 4. Because there is no address overlap between the read operations and write operations performed at the same clock cycle, data provided at the buffer output signal 208 of a buffer circuit 600 using either a write-before-read memory or a read-before-write memory are not corrupted.

Similarly, as shown in FIGS. 6A and 7B, a buffer circuit 600 may use a write-before-read memory for an FFT circuit outputting data in a digit-reverse order without data corruption in the buffer output signal 208. In FIG. 7B, a table 750 illustrates the read addresses and write addresses in a buffer circuit 600 used for a 16-point FFT circuit outputting data in a digit-reverse order. The 16-point FFT circuit may use a radix-4 FFT algorithm outputting data in a digit-reverse order, where a reversal to the digits is used to generate a digit-reversed order. For example, a digit in radix-4 is a pair of (two) consecutive bits. Binary representations of 0, 1, 2, 3, and 4 are 0000, 0001, 0010, 0011, and 0100 respectively, and the corresponding digit-reversed binary representations are 0000, 0100, 1000, 1100, and 0001 by reversing the binary representations in pairs of digits. As shown in table 750, at clock cycle 0, no write operation is performed. During clock cycles 1 through 16, 16 data words of a first data block are written to the memory 402 according to write addresses in a natural order. During the 16 clock cycles following the clock cycle 16, 16 data words of a second data block are written to the memory 402 according to write addresses in a digit-reversed order.

As shown in columns 506 and 510 of table 750, during clock cycles 0 through 15, no read operation is performed. During clock cycles 16 through 31 (cycles 24-31 are not shown in FIG. 7B), 16 data words of the first data block are read according to read addresses in a digit-reversed order. As such, data words of the first data block in the buffer output signal 208 are in a digit-reversed order. Similar to the buffer circuit 600 for an 8-point FFT, the buffer circuit 600 (FIG. 6A) for a 16-point FFT may use either a read-before-write memory or a write-before-read memory because address overlaps between read and write operations in the same clock cycle are removed.

Figure 8:
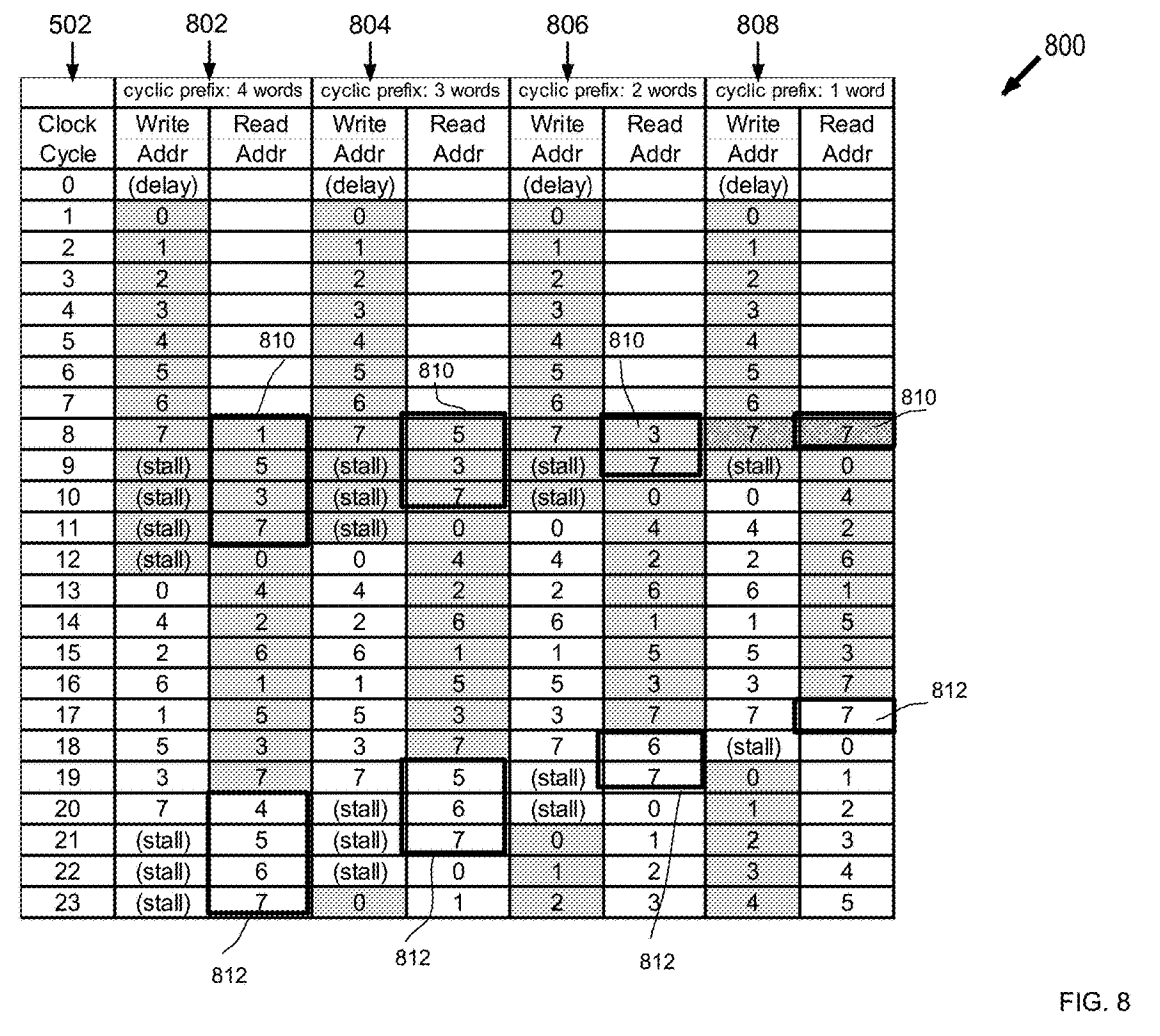

Referring to FIG. 8, a buffer circuit 650 of FIG. 6B may be used for an Orthogonal Frequency Division Multiplexing (OFDM) system (e.g., employed in a 3rd Generation Partnership Project (3GPP) Long Term Evolution (LTE) downlink system) with addressing schemes including cyclic prefixes. In such embodiments, the address generator 618 may generate read addresses including cyclic prefixes. In an example, data may not be written for a period having the same clock cycles as the period for which data is read for the cyclic prefixes. Accordingly, a gap (e.g., stalls) in writing is created.

Illustrated in FIG. 8 is a table 800 illustrating the read addresses and write addresses for the buffer circuit 650 (FIG. 6B) with addressing schemes including cyclic prefixes of different lengths. As shown in table 800, by applying a delay to the write operations in the memory 402 relative to the read operations, there is no address overlap between read and write operations in a buffer circuit 650 (FIG. 6B) with addressing schemes including cyclic prefixes longer than one data word. In a special case where a cyclic prefix includes only one data word, an address overlap between read and write operations may occur, which may be resolved by using a shadow register which is written to or read from when the read and write addresses are equal.

As illustrated in table 800 of FIG. 8, columns 802, 804, 806, and 808 illustrate write and read addresses in OFDM systems with a cyclic prefix having a length of 4, 3, 2, and 1 words respectively.

As shown in column 802, in an OFDM system with a cyclic prefix having 4 data words, the read and write operations of the buffer circuit 650 do not have address overlaps. During clock cycles 1 through 8, write operations are performed to write 8 data words of a first data block (frame). During clock cycles 9 through 12, the write operations are stalled for four clock cycles, which correspond to the word lengths of the cyclic prefix. During clock cycles 13 through 20, write operations are performed to write 8 data words of a second data block in a bit-reversed order, and are stalled during clock cycles 21 through 24 (cycle 24 not shown in FIG. 8).

As shown in column 802, during clock cycles 8 through 11, read operations are performed to read the last 4 data words of the first data block at read addresses 1, 5, 3, 7 in a bit-reversed order as a cyclic prefix 810 before the entire 8 data words of the first data block are read in a bit-reversed order. During clock cycles 12 through 19, read operations are performed to read the entire 8 data words of the first data block in a bit-reversed order. During clock cycles 20 through 23, the last 4 words at memory locations 4, 5, 6, and 7 of the second data block in a natural order are read as the cyclic prefix 812 before the entire 8 data words of the second data block are read in a natural order.

Similarly, as shown in columns 804 and 806, in OFDM systems with a cyclic prefix having 3 and 2 words respectively, the read and write operations of the buffer circuit 650 do not have address overlaps.

As shown in column 808, in an OFDM system with a cyclic prefix having one data word, addresses for the read operation and the write operation overlap at clock cycles 8 and 17. Such address overlapping may be avoided by using a shadow register which is written to or read from when the read and write addresses are equal. Note that such a shadow register usually is not required in practice, because typical cyclic prefixes are much larger than one data word. For example, the 3GPP LTE downlink specification provides that the cyclic prefixes are either not required or are between 9 and 512 data words long, and there is no address overlap in a buffer circuit 650 used in both cases.

Figure 9:
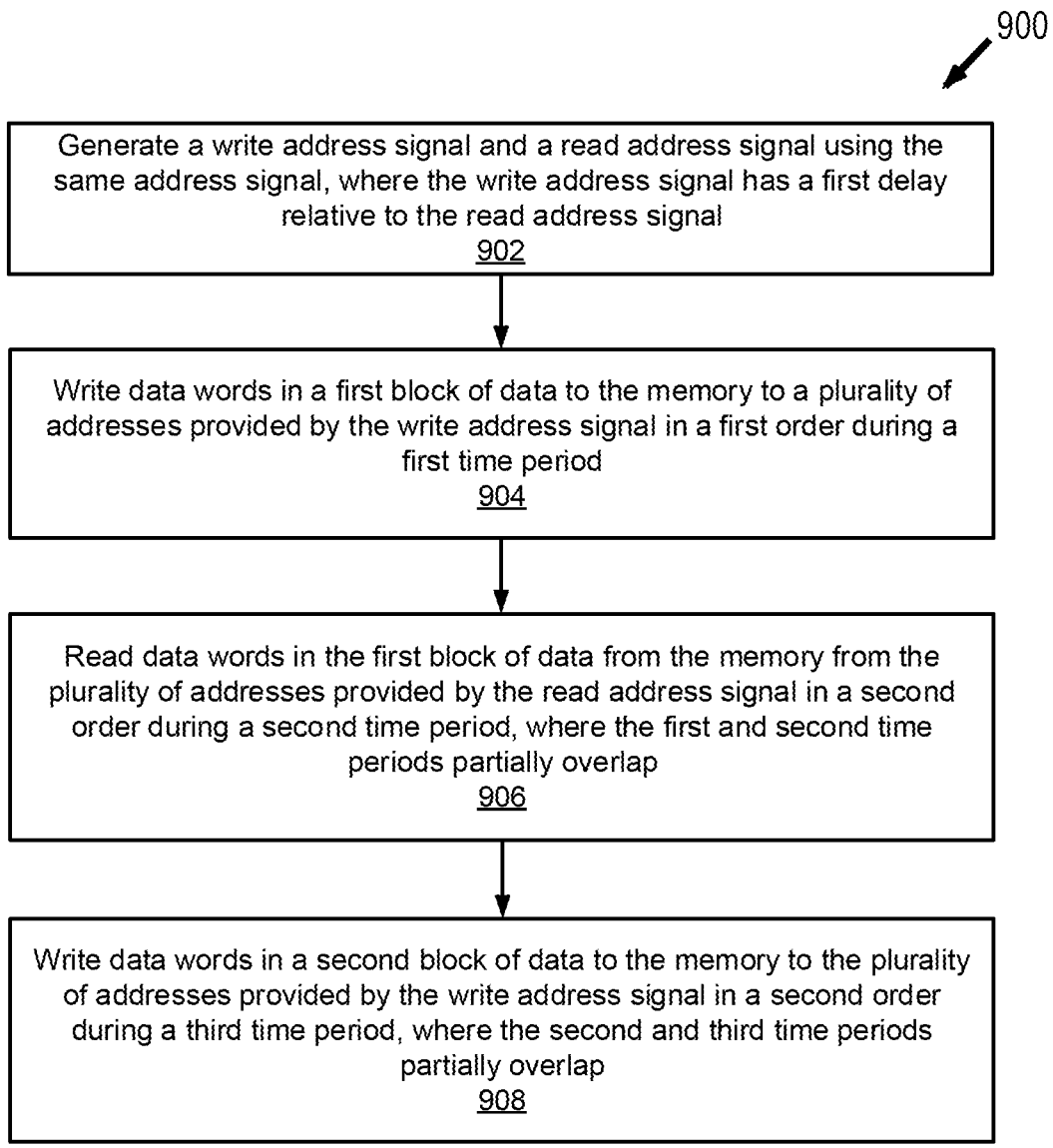
FIG. 9 is a flow diagram illustrating an exemplary method for buffering data according to some embodiments of the present disclosure.

Referring to FIG. 9, illustrated therein is a flowchart of a method 900 for buffering data. The method 900 may be implemented using the buffer circuit 600 of FIG. 6A, the buffer circuit 650 of FIG. 6B, and/or any other suitable circuits. The method 900 begins at block 902, where a write address signal and a read address signal are generated using a first address signal. In the example of the buffer circuit 600 of FIG. 6A, an address generator 618 generates a write address signal 612 and a read address signal 614 using the same address signal 406. Specifically, the address generator 618 uses a delay unit 606 that applies a delay period to the address signal 406 to generate the write address signal 612. The address generator 618 also generates a read address signal 614 using the address signal 406 without applying any delay. As such, the write address signal 612 has a delay relative to the read address signal 614. The write address signal 612 is then sent to a write address terminal 408 of the memory 402, and the read address signal 614 is then sent to a read address terminal 432 of the memory 402.

The method 900 may then proceed to block 904, where a sequence of data words of a first block of data are written to the memory during a first time period according to addresses provided by the write address signal 612, where the addresses are provided in a first order. In an example, as illustrated in table 700 of FIG. 7A, during a first time period including clock cycles 1 through 8, a sequence of data words in a first block of data are written to the memory 402 to addresses in a natural order (e.g., in an order of 0, 1, . . . , 7). The method 900 may then proceed to block 906, where the data words in the first block of data are read from the addresses provided by the read address signal 614, where the addresses are provided in a second order. In the example of table 700 of FIG. 7A, during a second time period including clock cycles 8 through 15, a sequence of data words of a first block of data are read from the memory 402 according to addresses in a bit-reversed order (e.g., in an order of 0, 4, 2, 6, . . . , 7). Note that the first time period for writing the first block of data and the second time period for reading the first block of data overlap at clock cycle 8. For example, at clock cycle 8, a data word in the first block of data is written to an address of 7. At the same clock cycle 8, another data word in the first block of data is read from an address of 0. Because the read and write operations are operating on different addresses at clock cycle 8, the memory 402 may operate in either a read-before-write mode or a write-before-read mode without causing any data corruption at the buffer output signal 208. The read data may be provided at the buffer output signal 208 through a read data terminal 424 of the memory 402. As such, the buffer circuit 600 reorders the first data block (e.g., from a natural order to a bit-reversed order).

The method 900 may then proceed to block 908, where a sequence of data words of a second block of data are written to the memory during a third time period according to addresses provided by the write address signal 612, where the addresses are provided in the second order. In the example illustrated in table 700 of FIG. 7A, during a third time period including clock cycles 9 through 16, a sequence of data words in a second block of data are written to the memory 402 at addresses in a bit-reversed order (e.g., in an order of 0, 4, 2, 6, . . . , 7). Note that the third time period for writing the second block of data and the second time period for reading the first block of data overlap at clock cycles 9 through 15. For example, at clock cycle 9, a data word in the second block of data is written to an address of 0. At the same clock cycle 9, another data word in the first block of data is read from an address of 4. Again, because the reading and writing are operating on different addresses at each of the clock cycles 9 through 15, the memory 402 may operate in either a read-before-write mode or a write-before-read mode.

The method 900 may then proceed to read the second block of data according to addresses provided by the read address signal 614, where the addresses are provided in the first order.

It is noted that various configurations (e.g., FFT radices, the length of the cyclic prefix, the delay between the write and read address signals) illustrated in FIGS. 2 through 9 are exemplary only and not intended to be limiting beyond what is specifically recited in the claims that follow. It will be understood by those skilled in that art in possession of this disclosure that other configurations may be used. For example, the buffer circuit 600 may be used as in various applications that may generate data in a modified order, including for example, applications using FFT and polar error-correcting codes. For applications using the polar error-correcting code, the butterfly structure of the polar error-correcting code may result in an output in a modified order (e.g., a bit-reversed order), which may then be restored to a natural order using the buffer circuit 600 for further processing. For further example, while the description of the buffer circuit 600 uses a simple dual-port memory, other types of memories including for example, a true dual-port memory, may be used.

Various advantages may be present in various applications of the present disclosure. No particular advantage is required for all embodiments, and different embodiments may offer different advantages. One of the advantages of some embodiments is that by identifying that the read operations for a particular block of data may not begin until write operations for almost all data words in the particular block of data have completed, read and write addresses overlapping is avoided by applying a delay to the write operations. This allows the buffer system to use either a write-before-read memory or a read-before-write memory. Another advantage of some embodiments is the low cost for implementing the delay to the write operations. For example, the delay to the write operations may be implemented by using registers on the write signals including for example, the write address signal, the write data signal, and the write enable signal. Yet another advantage of some embodiments is that in application-specific integrated circuit (ASIC) implementations, the buffer system for reordering may use a write-before-read memory that is readily available in ASIC libraries. Yet another advantage of some embodiments is that in FPGA implementations, by using a write-before-read memory that has better clock frequency performance than a read-before-write memory, circuit performance is improved. Yet another advantage of some embodiments is that by using a multi-port memory in the reordering buffer, throughput is improved. Yet another advantage of some embodiments is that the buffer system may be used for various FFT implementations, including for example, FFT implementations using various FFT radices and cyclic prefixes of various lengths.

Although particular embodiments have been shown and described, it will be understood that it is not intended to limit the claimed inventions to the preferred embodiments, and it will be obvious to those skilled in the art that various changes and modifications may be made without departing from the spirit and scope of the claimed invention. The specification and drawings are, accordingly, to be regarded in an illustrative rather than restrictive sense. The claimed invention is intended to cover alternatives, modifications, and equivalents.

What is claimed is:

1. A circuit, comprising:
an address generator configured to generate a write address signal and a read address signal, wherein the write address signal has a first delay relative to the read address signal;
a write data delay circuit configured to generate a delayed write data signal using a write data signal based on the first delay; and
a memory configured to:
 receive, from the write address signal, a first plurality of write addresses including a first plurality of addresses of the memory in a first order;
 write, to the first plurality of write addresses, a first plurality of data words of the delayed write data signal during a first time period;
 receive, from the read address signal, a first plurality of read addresses including the first plurality of addresses of the memory in a second order; and
 read, from the first plurality of read addresses, the first plurality of data words during a second time period,
 wherein the first delay is configured to eliminate an overlapping of read and write addresses during each of one or more clock cycles of a first overlap time period of the first and second time periods.

2. The circuit of claim 1, wherein the memory is further configured to:
receive, from the write address signal, a second plurality of write addresses including the first plurality of addresses in the second order; and
write a second plurality of data words to the second plurality of write addresses during a third time period, wherein a second overlap time period of the second and third time periods includes one or more clock cycles.

3. The circuit of claim 1, wherein the address generator is configured to generate the write address signal and read address signal using a first address signal, and wherein the address generator includes:
a first delay circuit configured to apply the first delay to the first address signal to generate the write address signal.

4. The circuit of claim 2,
wherein the first delay is configured to eliminate an overlapping of read and write addresses during each clock cycle of the second overlap time period.

5. The circuit of claim 4, further comprising:
a third delay circuit configured to apply the first delay to a write enable signal synchronized with the write data signal to generate a delayed write enable signal;
wherein the memory is configured to enable write operations to the memory based on the delayed write enable signal.

6. The circuit of claim 1, wherein the memory is a read-before-write memory.

7. The circuit of claim 1, wherein the memory is a write-before-read memory.

8. The circuit of claim 1, wherein the address generator includes:
a write address generator configured to generate a first address signal;
a read address generator configured to generate the read address signal synchronized with the first address signal; and
a first delay circuit configured to apply the first delay to the first address signal to generate the write address signal.

9. The circuit of claim 8, wherein the first plurality of read addresses include cyclic prefix addresses.

10. The circuit of claim 1, wherein the first order is one of a natural order and a modified order, and the second order is the other of the natural order and the modified order; and
wherein the modified order is one of a bit-reversed order and a digit-reversed order.

11. A method, comprising:
providing, to a memory, a write address signal and a read address signal, wherein the write address signal has a first delay relative to the read address signal;
generate a delayed write data signal using a write data signal based on the first delay;
writing, to the memory, a first plurality of data words of the delayed write data signal at a plurality of addresses according to a first order based on the write address signal during a first time period including a first clock cycle, wherein the writing of the first plurality of data words includes:
during the first clock cycle, writing a first data word of the first plurality of data words at a first address of the plurality of addresses; and
reading, from the memory, the first plurality of data words at the plurality of addresses according to a second order based on the write address signal during a second time period including the first clock cycle, wherein the reading of the first plurality of data words includes:
during the first clock cycle, reading a second data word of the first plurality of data words at a second address of the plurality of addresses, wherein the second address is different from the first address.

12. The method of claim 11, further comprising:
generating the read address signal and write address signal based on a first address signal.

13. The method of claim 12, further comprising:
writing, to the memory, a second plurality of data words at the plurality of addresses according to the second order based on the write address signal during a third time period including a second clock cycle; and
reading, from the memory, the second plurality of data words at the plurality of addresses according to the first order based on the read address signal during a fourth time period including the second clock cycle.

14. The method of claim 13, wherein the writing of the second plurality of data words includes:
during the second clock cycle, writing a third data word of the second plurality of data words at the second address of the plurality of addresses; and
wherein the reading of the second plurality of data words includes:
during the second clock cycle, reading a fourth data word of the first plurality of data words at a third address of the plurality of addresses,
wherein the third address is different from the second address.

15. The method of claim 11, wherein the first order is one of a natural order and a modified order, and the second order is the other of the natural order and the modified order.

16. The method of claim 15, wherein the modified order is one of a bit-reversed order and a digit-reversed order.

17. The method of claim 11, further comprising:
processing the first plurality of data words according to a Fourier transform function.

18. The method of claim 11, further comprising:
processing the first plurality of data words according to a polar error-correcting code.

19. The method of claim 11, wherein during the first clock cycle, the writing of the first data word is performed prior to the reading of the second data word.

20. The method of claim 11, wherein during the first clock cycle, the writing of the first data word is performed after the reading of the second data word.

* * * * *